United States Patent
Yoshizawa

(10) Patent No.: US 9,331,668 B2
(45) Date of Patent: May 3, 2016

(54) VIBRATOR WITH A BEAM-SHAPED PORTION ABOVE A RECESS IN A SUBSTRATE, AND OSCILLATOR USING SAME

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 134 days.

(21) Appl. No.: 14/218,053

(22) Filed: Mar. 18, 2014

(65) Prior Publication Data

US 2014/0292427 A1   Oct. 2, 2014

(30) Foreign Application Priority Data

Mar. 27, 2013  (JP) ................. 2013-066958

(51) Int. Cl.
  *H03H 9/24* (2006.01)
  *H03H 9/17* (2006.01)
  *H03H 9/02* (2006.01)
  (Continued)

(52) U.S. Cl.
  CPC . *H03H 9/17* (2013.01); *H03B 5/30* (2013.01); *H03H 9/02338* (2013.01); *H03H 9/2447* (2013.01); *H03B 5/02* (2013.01); *H03H 3/02* (2013.01); *H03H 2003/021* (2013.01); *H03H 2003/022* (2013.01); *H03H 2009/02291* (2013.01)

(58) Field of Classification Search
  CPC ...... B81B 3/0002; B81B 2201/0271; H03H 9/02244; H03H 9/02338; H03H 9/24; H03H 9/2405; H03H 9/2447; H03H 9/2468; H03H 9/2478; H03H 9/2484; H03H 2009/02291; H03H 9/17; H03H 3/02; H03H 2003/021; H03H 2003/022; H03B 5/30; H03B 5/32
  USPC ........................... 333/186, 187, 200; 310/370
  See application file for complete search history.

(56) References Cited

U.S. PATENT DOCUMENTS 5,552,655 A * 9/1996 Stokes ............... H03H 9/02228
                                                    310/321
6,621,134 B1 * 9/2003 Zurn ................... B81C 1/00246
                                                    257/415

(Continued)

FOREIGN PATENT DOCUMENTS

JP   A-09-130199   5/1997
JP   A-2004-312201   11/2004

(Continued)

*Primary Examiner* — Barbara Summons
(74) *Attorney, Agent, or Firm* — Oliff PLC

(57) ABSTRACT

A method for manufacturing a vibrator according to the present invention includes: forming a coating layer that covers a silicon substrate; patterning the coating layer; forming a semiconductor layer that covers the silicon substrate and the coating layer; forming a vibrating portion having a beam shape on the coating layer and a support portion that supports the vibrating portion by patterning the semiconductor layer; forming an opening that exposes the silicon substrate; forming a recess portion by removing the silicon substrate through the opening; and removing the coating layer. In the step of forming the vibrating portion and the support portion, the support portion having a first portion that is located on the silicon substrate, and a second portion that connects the first portion and the vibrating portion and is located on the coating layer is formed.

2 Claims, 14 Drawing Sheets

(51) Int. Cl.
*H03B 5/30* (2006.01)
*H03B 5/02* (2006.01)
*H03H 3/02* (2006.01)

(56) References Cited

U.S. PATENT DOCUMENTS

| | | | | |
|---|---|---|---|---|
| 7,312,674 | B2 * | 12/2007 | Duwel | H03H 3/02 |
| | | | | 310/334 |
| 7,346,178 | B2 * | 3/2008 | Zhe | H04R 31/003 |
| | | | | 381/174 |
| 7,579,662 | B2 * | 8/2009 | Tanaka | H03H 3/0072 |
| | | | | 257/415 |
| 7,830,215 | B2 | 11/2010 | Higuchi et al. | |
| 8,035,462 | B2 * | 10/2011 | Watanabe | H03H 3/0073 |
| | | | | 331/115 |
| 8,120,178 | B2 | 2/2012 | Higuchi et al. | |
| 2007/0195961 | A1 | 8/2007 | Komori | |
| 2010/0194248 | A1 | 8/2010 | Higuchi et al. | |
| 2012/0146736 | A1 * | 6/2012 | Kihara | B81C 1/0015 |
| | | | | 331/156 |

FOREIGN PATENT DOCUMENTS

| | | |
|---|---|---|
| JP | A-2007-221558 | 8/2007 |
| JP | A-2007-267109 | 10/2007 |
| JP | A-2008-182526 | 8/2008 |
| JP | A-2009-077159 | 4/2009 |
| JP | A-2012-244349 | 12/2012 |

* cited by examiner

VIBRATOR WITH A BEAM-SHAPED PORTION ABOVE A RECESS IN A SUBSTRATE, AND OSCILLATOR USING SAME

The entire disclosure of Japanese Patent Application No. 2013-066958, filed Mar. 27, 2013 is expressly incorporated by reference herein.

BACKGROUND

1. Technical Field

The present invention relates to a method for manufacturing a vibrator, a vibrator, and an oscillator.

2. Related Art

In recent years, piezoelectric vibrators have been developed that include a piezoelectric element having a piezoelectric layer sandwiched by top and bottom electrodes on a substrate. Such piezoelectric vibrators are used as, for example, oscillating portions (oscillator elements) of oscillators such as clock modules.

For example, JP-A-2007-267109 discloses the following steps: forming a piezoelectric element serving as a driving portion on an SOI (Silicon on Insulator) substrate; forming a plurality of beam portions (vibrating portions) and a gap portion in the silicon layer of the SOI substrate; removing the oxide layer of the SOI substrate via the gap portion; and forming an opening (recess portion) under the vibrating portions. JP-A-2007-267109 also discloses a support portion including a first support portion that is continuous to the silicon layer and a second support portion that is connected to the plurality of vibrating portions, the second support portion having a function of preventing vibrations of the plurality of vibrating portions from propagating to the first support portion. In order to have such a function, the length (the length in a direction parallel to the extending direction of the vibrating portions) of the support portion is an important factor in the design of piezoelectric vibrators.

However, in the technique disclosed in JP-A-2007-267109, because an SOI substrate is used, the cost is high. Furthermore, in the technique of JP-A-2007-267109, even if an inexpensive silicon substrate is used, in the technique of JP-A-2007-267109, etching performed to determine the depth of the recess portion and etching performed to determine the length of the support portion are performed in the same step, and it is therefore difficult to separately control the depth of the recess portion and the length of the support portion. For this reason, there are cases where it is not possible to form a highly accurate vibrator.

SUMMARY

An advantage of some aspects of the invention is to provide a method for manufacturing a vibrator having a high level of accuracy at a low cost. Also, an advantage of some aspects of the invention is to provide a vibrator having a high level of accuracy at a low cost, and an oscillator including the vibrator. The advantages of some aspects of the invention can be achieved in the following modes or application examples.

Application Example 1

One aspect of a method for manufacturing a vibrator of the invention includes: forming a first coating layer that covers a silicon substrate; patterning the first coating layer into a predetermined shape; forming a semiconductor layer that covers the silicon substrate and the first coating layer; forming a vibrating portion having a beam shape on the first coating layer and a support portion that supports the vibrating portion by patterning the semiconductor layer; forming an opening that exposes the silicon substrate by patterning the first coating layer in a region excluding the vibrating portion and the support portion; forming a recess portion at a position that overlaps the vibrating portion by removing the silicon substrate through the opening; and removing the first coating layer. In the step of forming the vibrating portion and the support portion, the support portion having a first portion that is located on the silicon substrate, and a second portion that connects the first portion and the vibrating portion and is located on the first coating layer is formed.

With the method for manufacturing a vibrator, the position of the border between the first portion and the second portion of the support portion is determined in the step of patterning the first coating layer into a predetermined shape. Furthermore, the position of the root end (the border between the second portion and the vibrating portion) of the vibrating portion is determined in the step of forming the vibrating portion having a beam shape on the first coating layer. Through the above steps, the length of the second portion of the support portion can be determined. Furthermore, in the method for manufacturing a vibrator, the depth of the recess portion can be determined in the step of forming the recess portion. Accordingly, in the method for manufacturing a vibrator, the length of the second portion of the support portion and the depth of the recess portion can be determined separately and independently (without being in conjunction with each other). In other words, the length of the second portion and the depth of the recess portion can be controlled separately. Accordingly, the method for manufacturing a vibrator can cope with various design requirements, and a vibrator having a high level of accuracy can be obtained.

Furthermore, in the method for manufacturing a vibrator, a silicon substrate is used. It is therefore possible to form a vibrator at a low cost as compared to the case of using an SOI substrate.

As described above, with the method for manufacturing a vibrator, it is possible to obtain a vibrator having a high level of accuracy at a low cost.

Application Example 2

The application example 1 may include: forming a second coating layer that covers the vibrating portion and the support portion before the step of forming the opening. In the step of forming the opening, the opening may be formed by patterning the first coating layer and the second coating layer, and in the step of removing the first coating layer, the first coating layer and the second coating layer may be removed.

With the method for manufacturing a vibrator, it is possible to, in the step of forming the recess portion, prevent the support portion and the vibrating portion from being exposed to an etching solution or the like. Accordingly, the support portion and the vibrating portion can be prevented from being etched.

Application Example 3

The application example 1 or 2 may include: forming a piezoelectric element on the semiconductor layer before the step of forming the vibrating portion and the support portion. In the step of forming the vibrating portion and the support portion, the semiconductor layer may be patterned such that the piezoelectric element is located on the vibrating portion.

The method for manufacturing a vibrator can cause the vibrating portion to vibrate by the piezoelectric effect of the piezoelectric element.

Application Example 4

In any one of the application examples 1 to 3, in the step of forming the vibrating portion, the vibrating portion made of a single-anchored beam may be formed, and in the step of forming the opening, the opening may be formed on a tip end side of the vibrating portion from a root end side of the vibrating portion.

The method for manufacturing a vibrator can reliably cause the first portion of the support portion to be in contact with the silicon substrate even if, for example, the amount of overetching that occurs when forming the recess portion is large.

Application Example 5

In any one of the application examples 1 to 4, in the step of forming the vibrating portion and the support portion, a plurality of the vibrating portions may be formed, and adjacent ones of the vibrating portions may be displaced in opposite directions from each other, and vibrate in a thickness direction of the silicon substrate.

With the method for manufacturing a vibrator, in the second portion of the support portion, stress (torsion) caused by vibrations of the vibrating portion can be relieved. As a result, it is possible to prevent the stress caused by vibrations of the vibrating portion from being transferred to the first portion of the support portion.

Application Example 6

In any one of the application examples 1 to 5, patterning performed in the step of patterning the first coating layer into a predetermined shape and patterning performed in the step of forming the vibrating portion and the support portion may be performed by photolithography and etching.

With the method for manufacturing a vibrator, variations in the length of the second portion of the support portion can be reduced.

Application Example 7

One aspect of a vibrator of the invention includes: a silicon substrate having a recess portion formed from a surface thereof; and a semiconductor layer having a beam-shaped vibrating portion that is formed above the recess portion with a gap interposed therebetween and a support portion that is formed on the surface and supports the vibrating portion. The support portion includes: a first portion that is fixed to the surface; and a second portion that connects the first portion and the vibrating portion and is formed above the surface with a gap interposed therebetween. The vibrating portion extends in a first direction from the second portion, and a dimension in a second direction of the second portion is greater than a dimension in the second direction of the vibrating portion, the second direction being a direction intersecting the first direction.

The vibrator can have a high level of accuracy at a low cost.

Application Example 8

One aspect of an oscillator of the invention includes the vibrator described in the application example 7 and a circuit portion for driving the vibrating portion.

The oscillator includes the vibrator of the invention, and thus can have a high level of accuracy at a low cost.

BRIEF DESCRIPTION OF THE DRAWINGS

The invention will be described with reference to the accompanying drawings, wherein like numbers reference like elements.

DESCRIPTION OF EXEMPLARY EMBODIMENT

Hereinafter, a preferred embodiment of the invention will be described in detail with reference to the drawings. It is to be understood that the embodiments described below are not intended to unduly limit the scope of the invention recited in the claims. It is also understood that all of the constituent elements described below are not necessarily essential to the invention.

1. Vibrator

Figure 1:
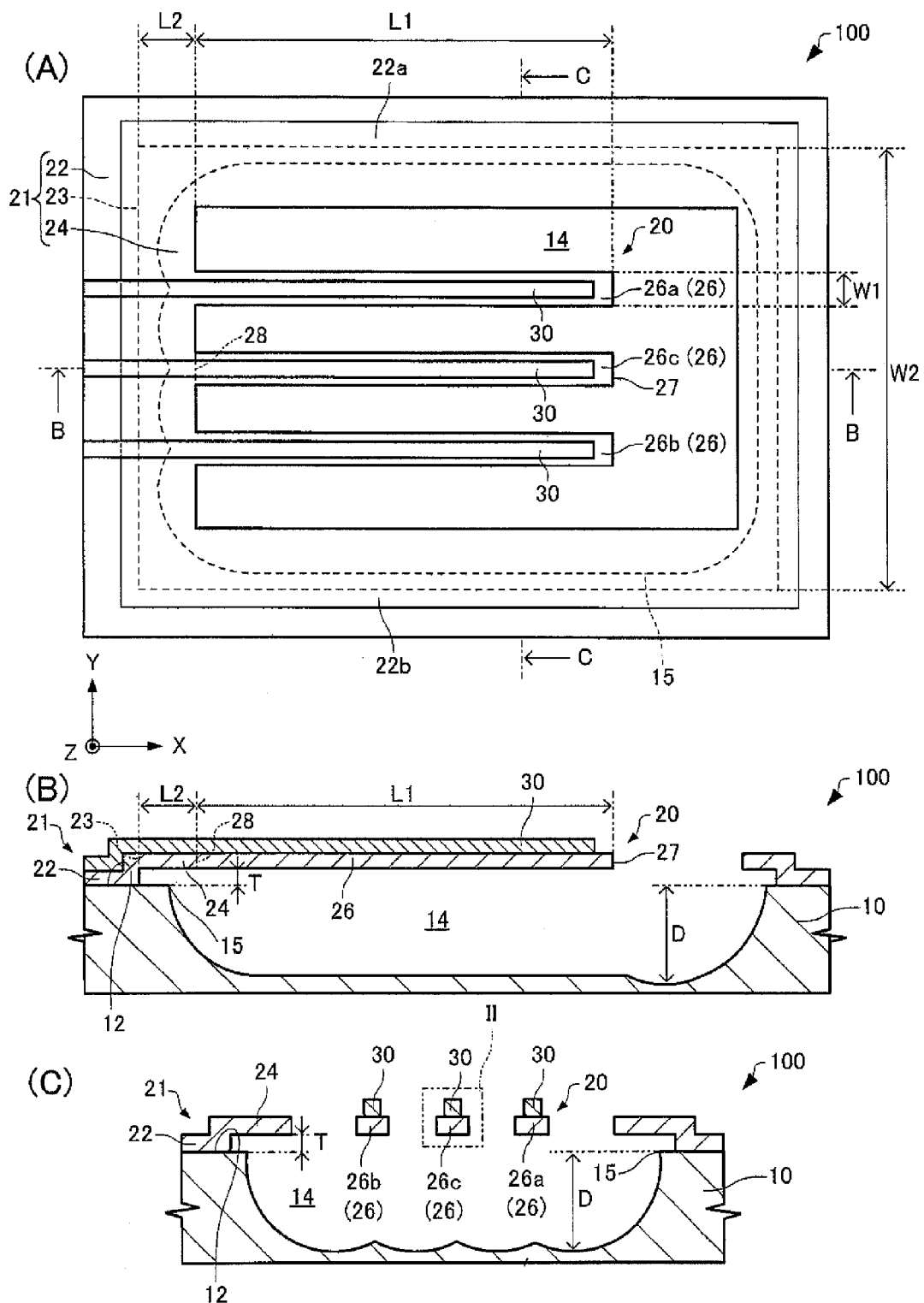
FIG. 1 shows a schematic plan view and cross-sectional views of a vibrator according to an embodiment of the invention.

A vibrator according to an embodiment of the invention will be described with reference to the drawings. FIG. 1 shows a schematic plan view and cross-sectional views of a vibrator 100 according to the present embodiment. FIG. 1A shows a plan view of the vibrator 100, FIG. 1B shows a cross-sectional view taken along the line B-B of FIG. 1A, and FIG. 1C shows a cross-sectional view taken along the line C-C of FIG. 1A. Also, in FIG. 1A, three mutually orthogonal axes, namely, X axis, Y axis and Z axis, are shown. Hereinafter, a direction parallel to the X axis will be referred to as the "X axis direction (first direction)", a direction parallel to the Y axis will be referred to as the "Y axis direction (second direction)", and a direction parallel to the Z axis will be referred to as the "Z axis direction".

As shown in FIG. 1, the vibrator 100 includes a silicon substrate 10, a semiconductor layer 20 and a piezoelectric element 30.

The silicon substrate 10 is a substrate made of, for example, silicon. In the example shown in FIG. 1, the silicon substrate 10 has a planar shape (a shape as viewed from the Z axis direction) that is rectangular. The silicon substrate 10 has a surface 12. The surface 12 is, for example, a flat surface.

A recess portion 14 is formed from the surface 12 of the silicon substrate 10. The recess portion 14 has a depth D (a dimension in the Z axis direction) of, for example, 0.1 to 200 μm. The recess portion 14 is formed at a position that overlaps a vibrating portion 26 of the semiconductor layer 20 in plan view (as viewed from the Z axis direction). Because the recess portion 14 is formed, the vibrating portion 26 can vibrate without coming into contact with the silicon substrate 10.

The semiconductor layer 20 is formed on the silicon substrate 10. The semiconductor layer 20 is, for example, a silicon layer. To be more specific, the semiconductor layer 20 is made of polysilicon. The semiconductor layer 20 includes a support portion 21 and the vibrating portion 26. The support portion 21 and the vibrating portion 26 are integrally formed.

The support portion 21 is formed on the surface 12 of the silicon substrate 10. The support portion 21 supports the vibrating portion 26. The support portion 21 includes a first portion 22 and a second portion 24. The first portion 22 and the second portion 24 are integrally formed.

The first portion 22 of the support portion 21 is fixed to the surface 12 of the silicon substrate 10. The first portion 22 is formed at a position spaced apart from an edge (outer perimeter) 15 of the recess portion 14. In this example, in plan view, the first portion 22 is formed so as to surround the recess portion 14, and has a rectangular frame shape. As shown in FIG. 1B, the first portion 22 has a substantially L shape composed of a thin portion and a thick portion. The second portion 24 is connected to the thick portion.

The second portion 24 of the support portion 21 connects the first portion 22 and the vibrating portion 26. The second portion 24 is formed above the surface 12 of the silicon substrate 10 with a gap interposed therebetween. In other words, the support portion 21 has an upstanding shape. A distance T between the second portion 24 and the surface 12 is, for example, 0.001 to 10 μm. In this example, in plan view, the second portion 24 extends from the first portion 22 surrounding the recess portion 14, and has a rectangular frame shape.

The vibrating portion 26 is connected to the second portion 24, and extends in the X axis direction from the second portion 24. The vibrating portion 26 is formed above the recess portion 14 with a gap interposed therebetween. In this example, in plan view, the vibrating portion 26 is entirely located above the recess portion 14. The vibrating portion 26 has a beam shape whose lengthwise direction extends in the X axis direction. The planar shape of the vibrating portion 26 is, for example, rectangular. In this example, the shape of the vibrating portion 26 is a single-anchored beam shape having one end connected to the support portion 21. In other words, the vibrating portion 26 is a cantilever. Although not shown, the vibrating portion 26 may have a double-anchored beam shape having both ends connected to the support portion 21.

A dimension (specifically, a distance between a tip end 27 and a root end 28 of the vibrating portion 26) L1 in the X axis direction of the vibrating portion 26 is, for example, 0.1 to 1000 μm. A distance (a distance in the X axis direction) L2 between the root end 28 of the vibrating portion 26 and a border 23 between the first portion 22 and the second portion 24 is, for example, 0.1 to 500 μm. L2 is less than or equal to L1. It can be said that L2 is a dimension (length) in the X axis direction of the second portion 24 connecting the vibrating portion 26 and the first portion 22. It can also be said that the root end 28 of the vibrating portion 26 is a border between the second portion 24 and the vibrating portion 26.

A dimension W1 in a direction intersecting the X axis direction of the vibrating portion 26 (specifically, in the Y axis direction) is, for example, 0.1 to 1000 μm. A dimension W2 in the Y axis direction of the second portion 24 connecting the vibrating portion 26 and the first portion 22 is, for example, 1 to 10000 μm. W2 is greater than W1. It can be said that W2 is a distance between extending portions 22a and 22b, which extend in the X axis direction, of the first portion 22 having a rectangular frame shape in plan view.

A plurality of the vibrating portions 26 are provided. In this example, three vibrating portions 26 are provided. The three vibrating portions 26 are, for example, equidistantly spaced apart from each other. The vibrating portions 26 vibrate in a thickness direction (the Z axis direction) of the silicon substrate 10 by the piezoelectric effect (the phenomenon in which the piezoelectric element 30 deforms in response to application of voltage to the piezoelectric element 30) of the piezoelectric element 30. Vibrating portions 26a and 26b and a vibrating portion 26c located between the vibrating portions 26a and 26b are displaced in opposite directions from each other. To be specific, when the vibrating portions 26a and 26b are displaced in +Z axis direction (upward), the vibrating portion 26c is displaced in −Z axis direction (downward). Conversely, when the vibrating portions 26a and 26b are displaced in the −Z axis direction, the vibrating portion 26c is displaced in the +Z axis direction. In this way, as a result of the vibrating portions 26a and 26b and the vibrating portion 26c being displaced in opposite directions from each other, in the second portion 24 of the support portion 21, stress (torsion) caused by vibrations of the vibrating portions 26a, 26b and 26c can be relieved. It is thereby possible to prevent the stress caused by vibrations of the vibrating portions 26a, 26b and 26c from being transferred to the first portion 22 of the support portion 21.

Although not shown, the number of the vibrating portions 26 may be one. In this case as well, in the second portion 24 of the support portion 21, the stress caused by vibrations of the vibrating portion 26 can be relieved, but the effect of relieving stress in the second portion 24 is particularly effective in a configuration in which a plurality of vibrating portions 26 are provided and adjacent vibrating portions 26 are displaced in opposite directions from each other as described above.

Figure 2:
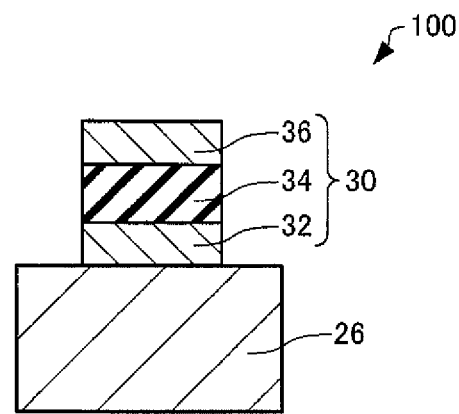
FIG. 2 is a schematic cross sectional view of a piezoelectric element of the vibrator according to the embodiment of the invention.

The piezoelectric element 30 is formed on the vibrating portion 26. A plurality of the piezoelectric elements 30 are formed so as to correspond to the plurality of vibrating portions 26. FIG. 2 is an enlarged diagram of the region II shown in FIG. 1C, and schematically showing a piezoelectric element 30 in cross section. As shown in FIG. 2, the piezoelectric element 30 includes a first electrode layer 32, a piezoelectric layer 34 and a second electrode layer 36.

The first electrode layer 32 of the piezoelectric element 30 is formed on the vibrating portion 26. The first electrode layer 32 is made of, for example, platinum, iridium, nickel, or a conductive oxide thereof. The first electrode layer 32 is one of electrodes for applying voltage to the piezoelectric layer 34.

The piezoelectric layer 34 of the piezoelectric element 30 is formed on the first electrode layer 32. The piezoelectric layer 34 is made of, for example, lead zirconate titanate (Pb(Zr, Ti)$O_3$: PZT), lead zirconate titanate niobate (Pb(Zr, Ti, Nb)$O_3$: PZTN), or barium titanate (BaTi$O_3$). The piezoelectric layer 34 may have a piezoelectric property, and may deform by application of voltage by the electrode layers 32 and 36.

The second electrode layer 36 of the piezoelectric element 30 is formed on the piezoelectric layer 34. The second electrode layer 36 is made of, for example, platinum, iridium, nickel, or a conductive oxide thereof. The second electrode layer 36 is the other electrode for applying voltage to the piezoelectric layer 34.

The piezoelectric element 30 may not be formed on the support portion 21 as long as the piezoelectric element 30 is formed on the vibrating portion 26. For example, on the support portion 21, first wiring (not shown) connected to the first electrode layer 32 and second wiring (not shown) connected to the second electrode layer 36 may be formed.

Although not shown, the first electrode layer 32 of the piezoelectric element 30 formed on the vibrating portion 26a, the first electrode layer 32 of the piezoelectric element 30 formed on the vibrating portion 26b, and the second electrode layer 36 of the piezoelectric element 30 formed on the vibrating portion 26c are electrically connected to a first pad. Likewise, the second electrode layer 36 of the piezoelectric element 30 formed on the vibrating portion 26a, the second electrode layer 36 of the piezoelectric element 30 formed on the vibrating portion 26b, and the first electrode layer 32 of the piezoelectric element 30 formed on the vibrating portion 26c are electrically connected to a second pad. With this configuration, by application of voltage (alternating voltage) between the first pad and the second pad, the vibrating portions 26a and 26b and the vibrating portion 26c can be displaced in opposite directions from each other as described above.

The vibrator 100 has, for example, the following features.

With the vibrator 100, the length L2 of the second portion 24 and the depth D of the recess portion 14 can be controlled separately (details will be described later). Accordingly, the vibrator 100 can have a high level of accuracy. Furthermore, in the vibrator 100, the silicon substrate 10 is used. For this reason, the vibrator 100 is less expensive as compared to the case of using a substrate on which a very thick (for example, 1.0 μm or more) silicon oxide layer is formed on an SOI substrate or silicon substrate. As described above, the vibrator 100 can have a high level of accuracy at a low cost.

With the vibrator 100, the support portion 21 supporting the vibrating portion 26 includes the first portion 22 fixed on the surface 12 of the silicon substrate 10, and the second portion 24 that connects the first portion 22 and the vibrating portion 26 and is formed above the surface 12 with a gap interposed therebetween. Accordingly, the distance between the tip end 27 of the vibrating portion 26 and the bottom surface of the recess portion 14 can be increased as compared to the configuration in which, for example, the vibrating portion extends from the second portion that is in contact with the surface of the silicon substrate. It is thereby possible to, in the step of, for example, cleaning the recess portion 14, prevent the vibrating portion 26 from adhering (sticking) to the bottom surface of the recess portion 14 due to surface tension.

In the vibrator 100, the second portion 24 of the support portion 21 is located above the edge 15 of the recess portion 14. Thus, even if, for example, the vibrating portion 26 is displaced toward the bottom surface of the recess portion 14 due to the surface tension, the second portion 24 comes into contact with the edge 15, and it is thereby possible to prevent the occurrence of sticking. Because the contact area between the second portion 24 and the edge 15 is small, it is unlikely that the second portion 24 adheres to the edge 15.

2. Method for Producing a Vibrator

A method for manufacturing a vibrator according to the present embodiment will be described next with reference to the drawings. FIGS. 3 to 11 show schematic plan views and cross-sectional views of a manufacturing process of the vibrator 100 of the present embodiment. FIGS. 3A to 11A are plan views, FIGS. 3B to 11B are cross-sectional views taken along the line B-B of FIGS. 3A to 11A, and FIGS. 3C to 11C are cross-sectional views taken along the line C-C of FIGS. 3A to 11A. Also, in FIGS. 3A to 11A, three mutually orthogonal axes, namely, X axis, Y axis and Z axis, are shown.

Figure 3:
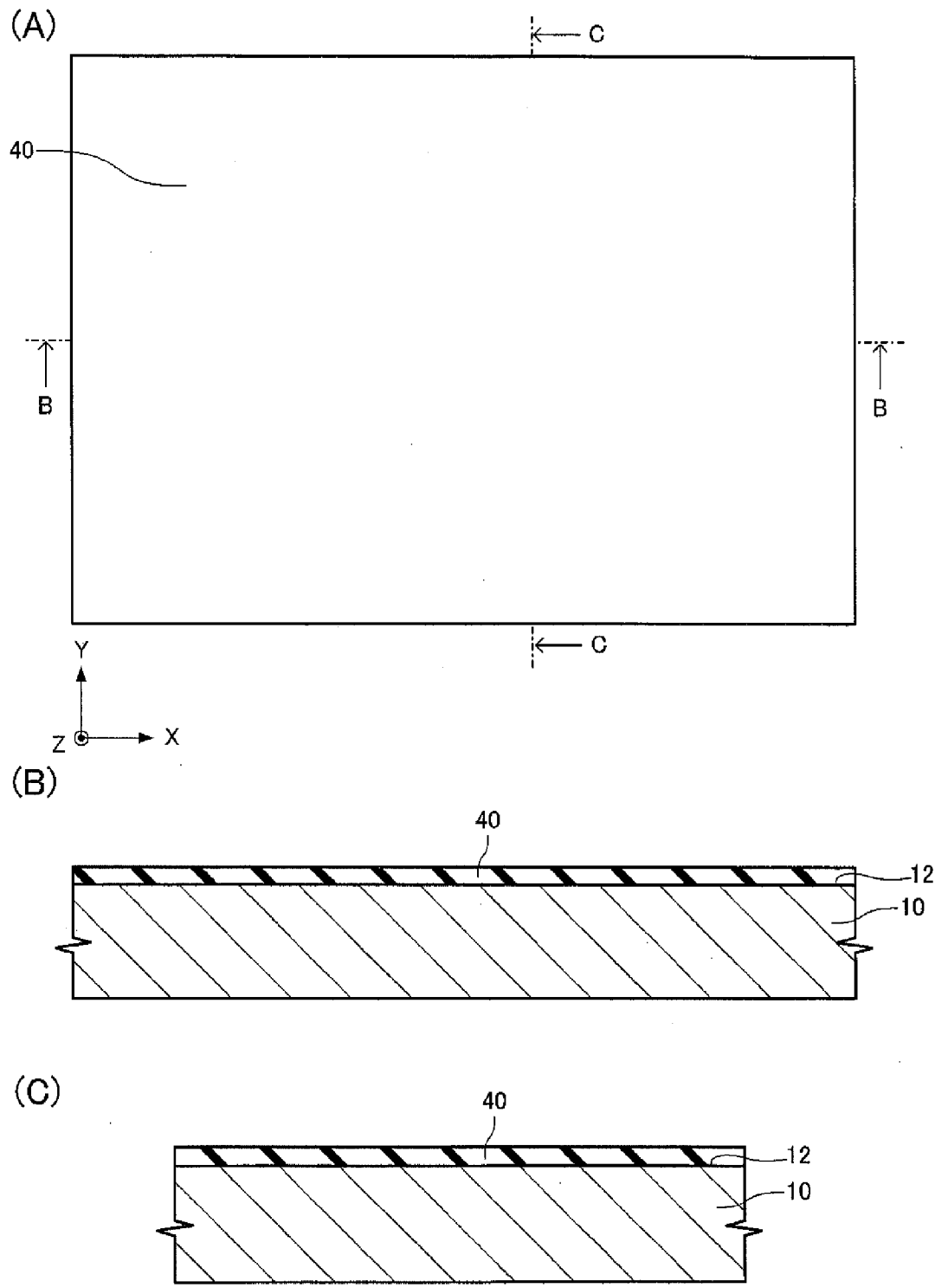
FIG. 3 shows a schematic plan view and cross-sectional views of a manufacturing step of the vibrator according to the embodiment of the invention.

As shown in FIG. 3, a first coating layer 40 that covers the surface 12 of the silicon substrate 10 is formed. The first coating layer 40 is formed by, for example, a CVD (Chemical Vapor Deposition) method or a sputtering method. The thickness of the first coating layer 40 is determined as appropriate taking into consideration film stress developed in the first coating layer 40 and a residue of etching formed when the first coating layer 40 is etched. To be specific, the thickness (dimension in the Z axis direction) of the first coating layer 40 is the same as the distance T (see FIG. 1) between the second portion 24 of the support portion 21 and the surface 12 of the silicon substrate 10. The first coating layer 40 is preferably made of a material having a high etching selectivity with respect to the silicon substrate 10 and the semiconductor layer 20. To be specific, the first coating layer 40 is a silicon oxide (Si$O_2$) layer, a silicon nitride (SiN) layer, or a silicon oxynitride (SiON) layer.

Figure 4:
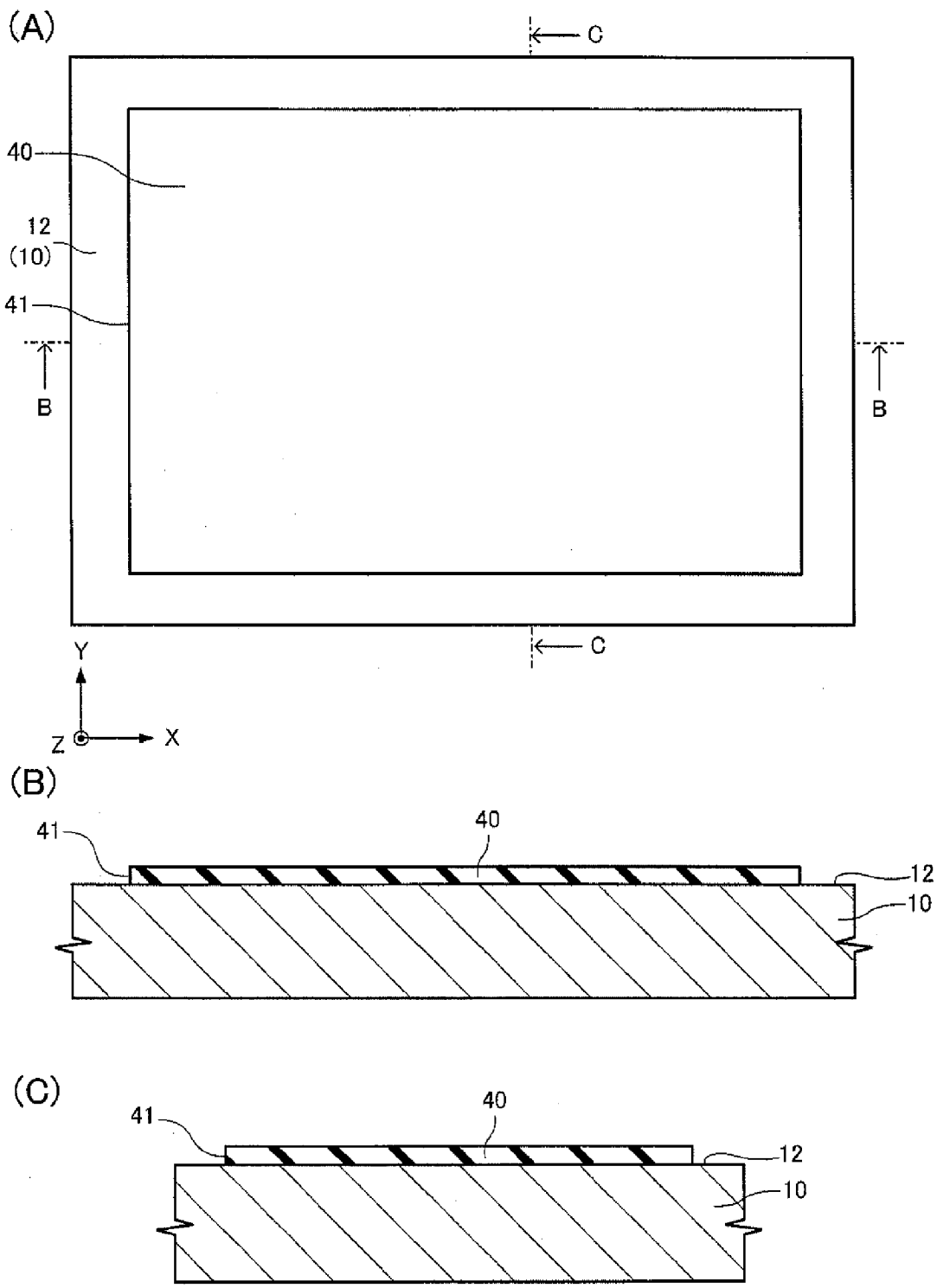
FIG. 4 shows a schematic plan view and cross-sectional views of a manufacturing step of the vibrator according to the embodiment of the invention.

As shown in FIG. 4, the first coating layer 40 is patterned into a predetermined shape. The patterning is performed by photolithography and etching. Through this step, the surface 12 of the silicon substrate 10 is exposed. In this example, the first coating layer 40 is patterned into a rectangular shape, and the exposed surface 12 has a planar shape that is a rectangular frame shape. In plan view, an outer edge 41 of the first coating layer 40 serves as the border 23 (see FIG. 1) between the first portion 22 and the second portion 24 of the support portion 21. In other words, the position of the border 23 is determined through this step.

Figure 5:
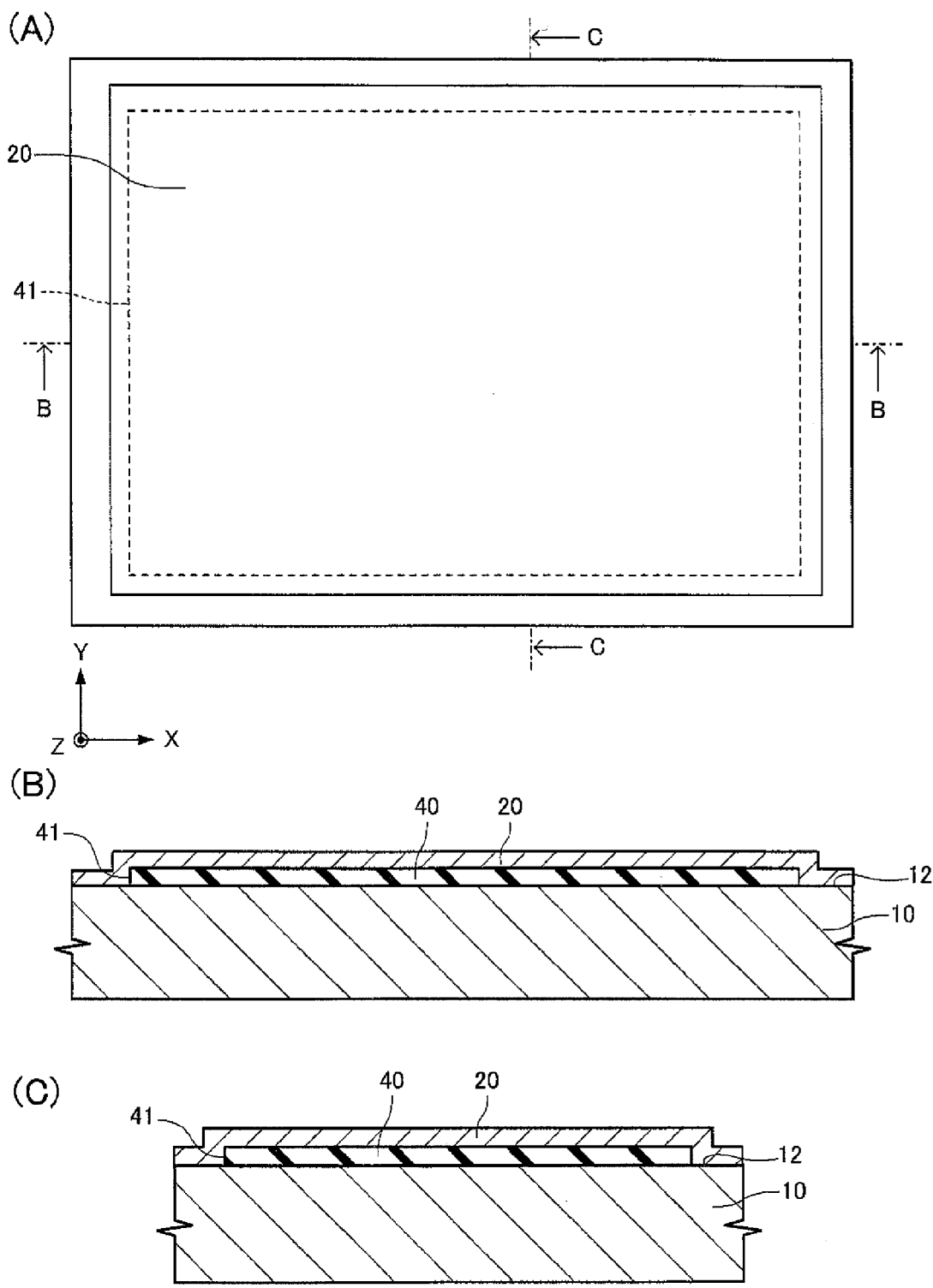
FIG. 5 shows a schematic plan view and cross-sectional views of a manufacturing step of the vibrator according to the embodiment of the invention.

As shown in FIG. 5, a semiconductor layer 20 that covers the exposed surface 12 of the silicon substrate 10 and the first coating layer 40 is formed. The semiconductor layer 20 is formed by, for example, a CVD method or a sputtering method.

Figure 6:
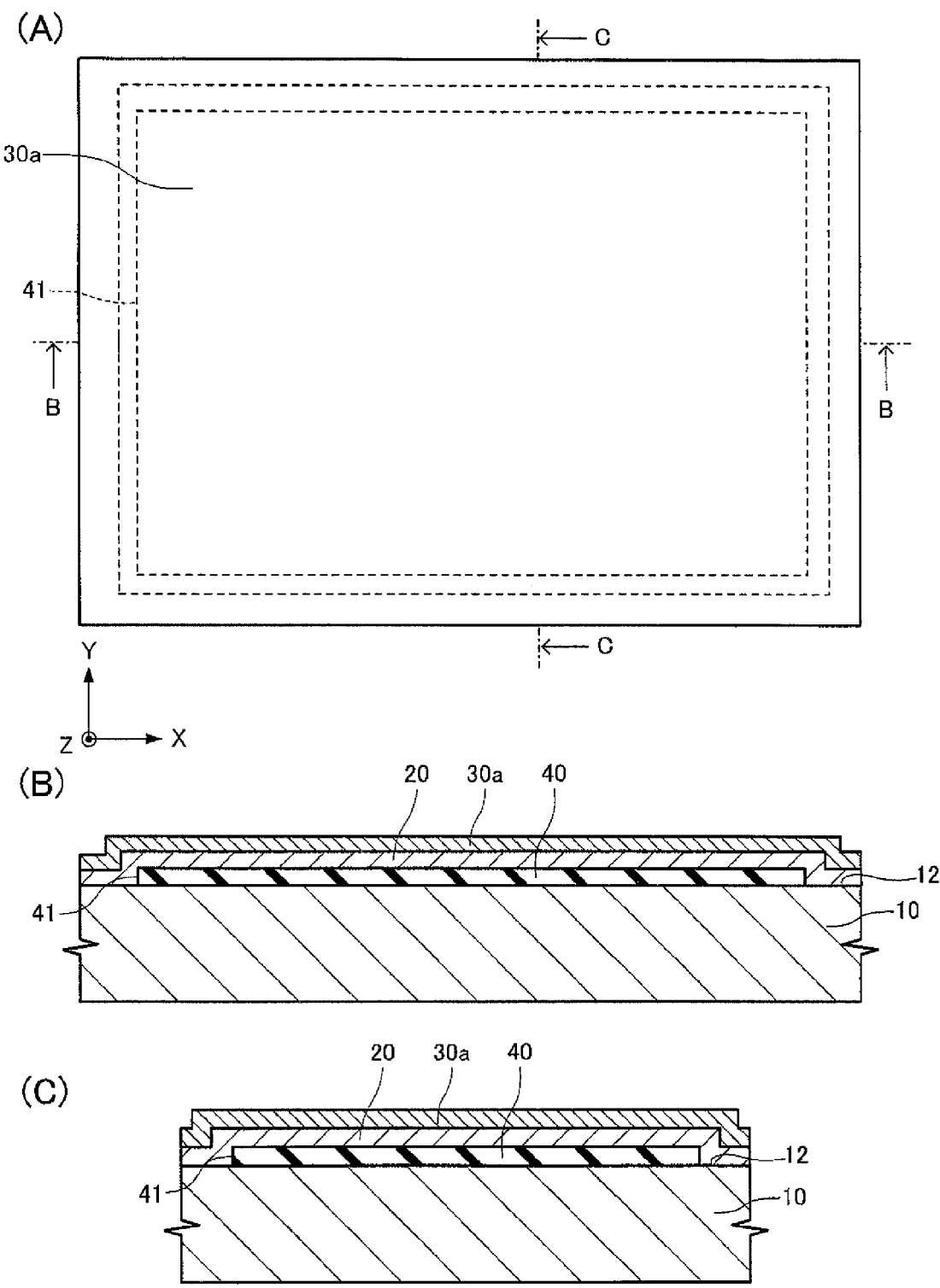
FIG. 6 shows a schematic plan view and cross-sectional views of a manufacturing step of the vibrator according to the embodiment of the invention.

As shown in FIG. 6, a piezoelectric element layer 30a that covers the first coating layer 40 is formed. The piezoelectric element layer 30a is a layer that constitutes piezoelectric elements 30. The piezoelectric element layer 30a is obtained by forming, on the semiconductor layer 20, a first electrode layer 32, a piezoelectric layer 34 and a second electrode layer 36 in this order (see FIG. 2). The electrode layers 32 and 36 are formed by, for example, a vacuum deposition method or a sputtering method. The piezoelectric layer 34 is formed by, for example, a sputtering method, a sol-gel method, a laser abrasion method.

Figure 7:
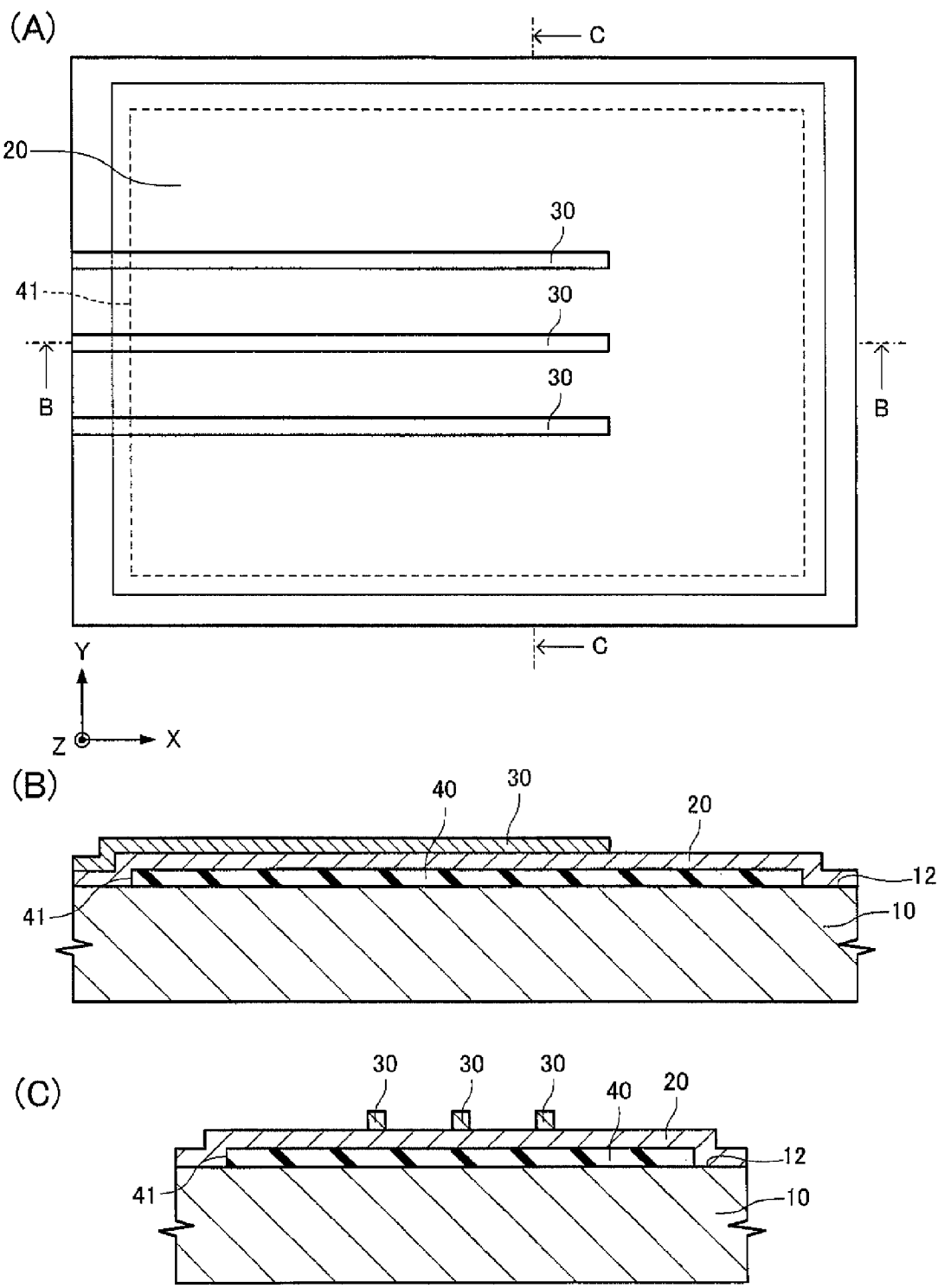
FIG. 7 shows a schematic plan view and cross-sectional views of a manufacturing step of the vibrator according to the embodiment of the invention.

As shown in FIG. 7, the piezoelectric element layer 30a is patterned into a predetermined shape. The pattering is performed by photolithography and etching. In this example, the piezoelectric element layer 30a is patterned in to rectangular shapes. Through this step, piezoelectric elements 30 can be formed on the semiconductor layer 20.

Figure 8:
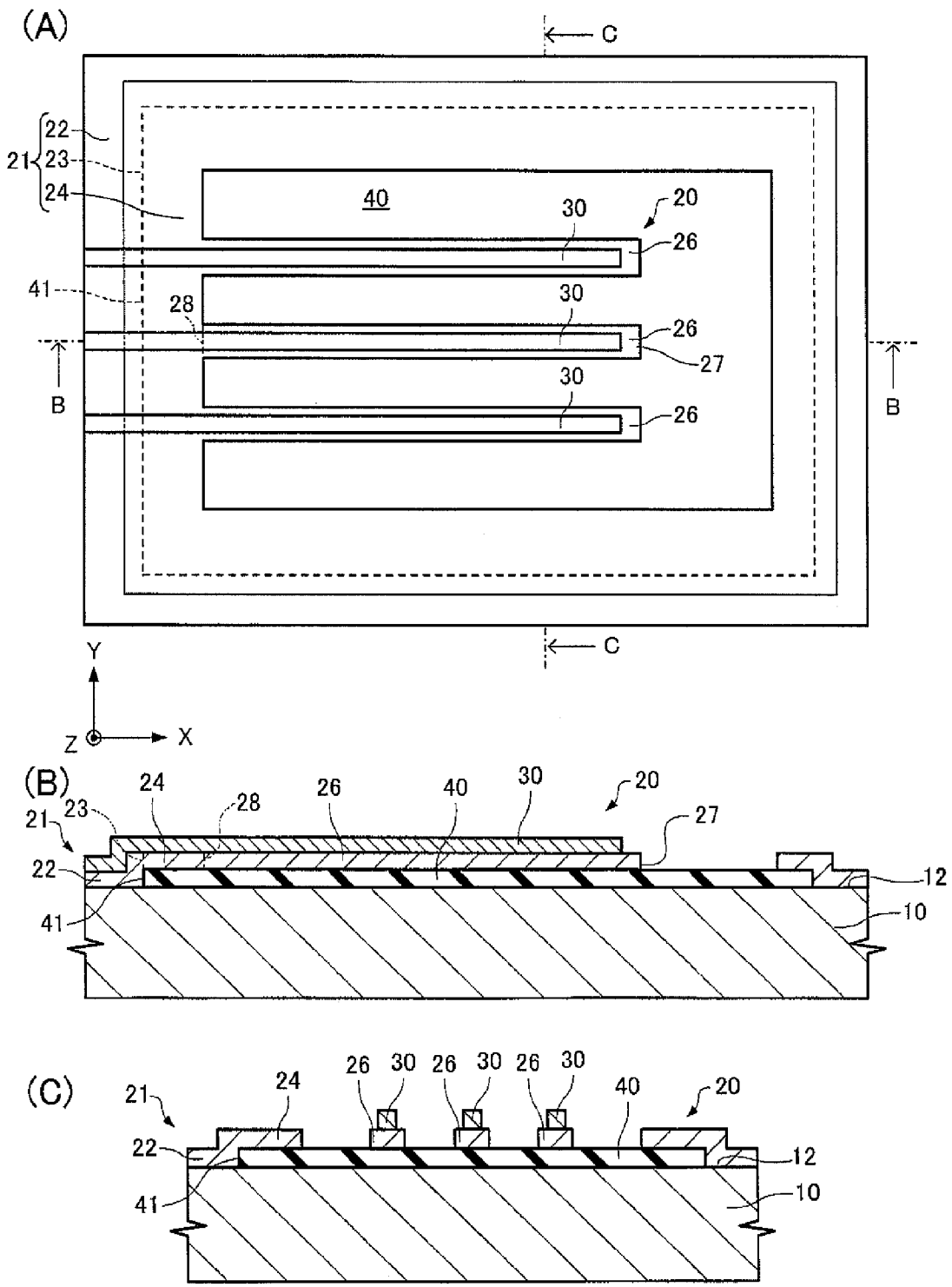
FIG. 8 shows a schematic plan view and cross-sectional views of a manufacturing step of the vibrator according to the embodiment of the invention.

As shown in FIG. 8, the semiconductor layer 20 is patterned so as to form beam-shaped vibrating portions 26 on the first coating layer 40, and a support portion 21 for supporting the vibrating portions 26. To be specific, the support portion 21 having the first portion 22 located on the silicon substrate 10, and the second portion 24 that connects the first portion 22 and the vibrating portions 26 and is located on the first coating layer 40 is formed. The pattering is performed by photolithography and etching. In this step, the semiconductor layer 20 is patterned such that the piezoelectric elements 30 are on the vibrating portions 26. Furthermore, in this step, the semiconductor layer 20 is patterned such that, in plan view, the root end 28 of the vibrating portion 26 is located above the first coating layer 40. The position of the root end 28 of the vibrating portion 26 (the border between the second portion 24 and the vibrating portion 26) is determined through this step.

Figure 9:
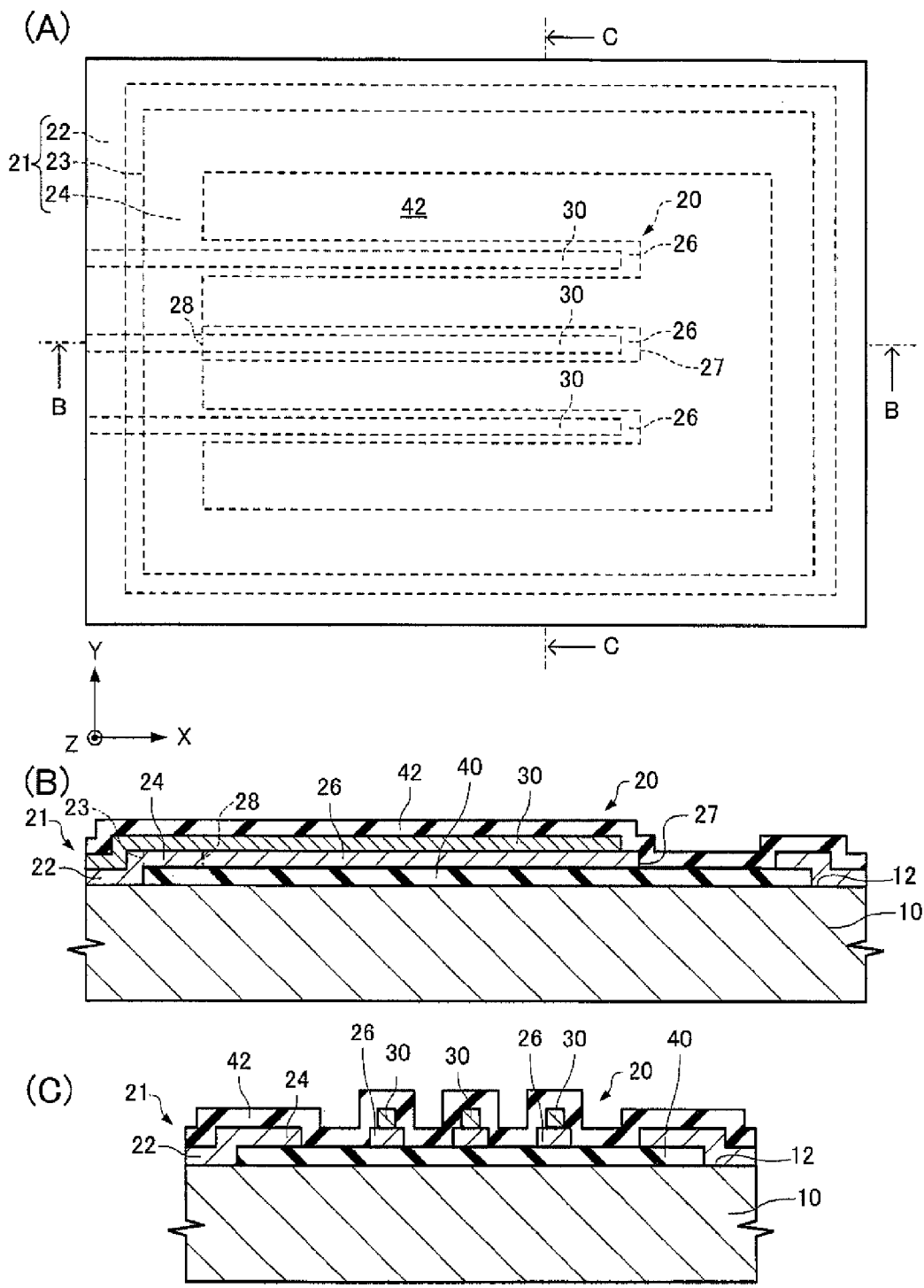
FIG. 9 shows a schematic plan view and cross-sectional views of a manufacturing step of the vibrator according to the embodiment of the invention.

As shown in FIG. 9, a second coating layer 42 that covers the support portion 21, the vibrating portions 26 and the piezoelectric elements 30 is formed. The second coating layer 42 is formed by, for example, the same method as the first coating layer 40. The second coating layer 42 is preferably made of a material having a high etching selectivity with respect to the silicon substrate 10 and the semiconductor layer 20. To be specific, the second coating layer 42 is a layer made of the same material as that of the first coating layer 40.

Figure 10:
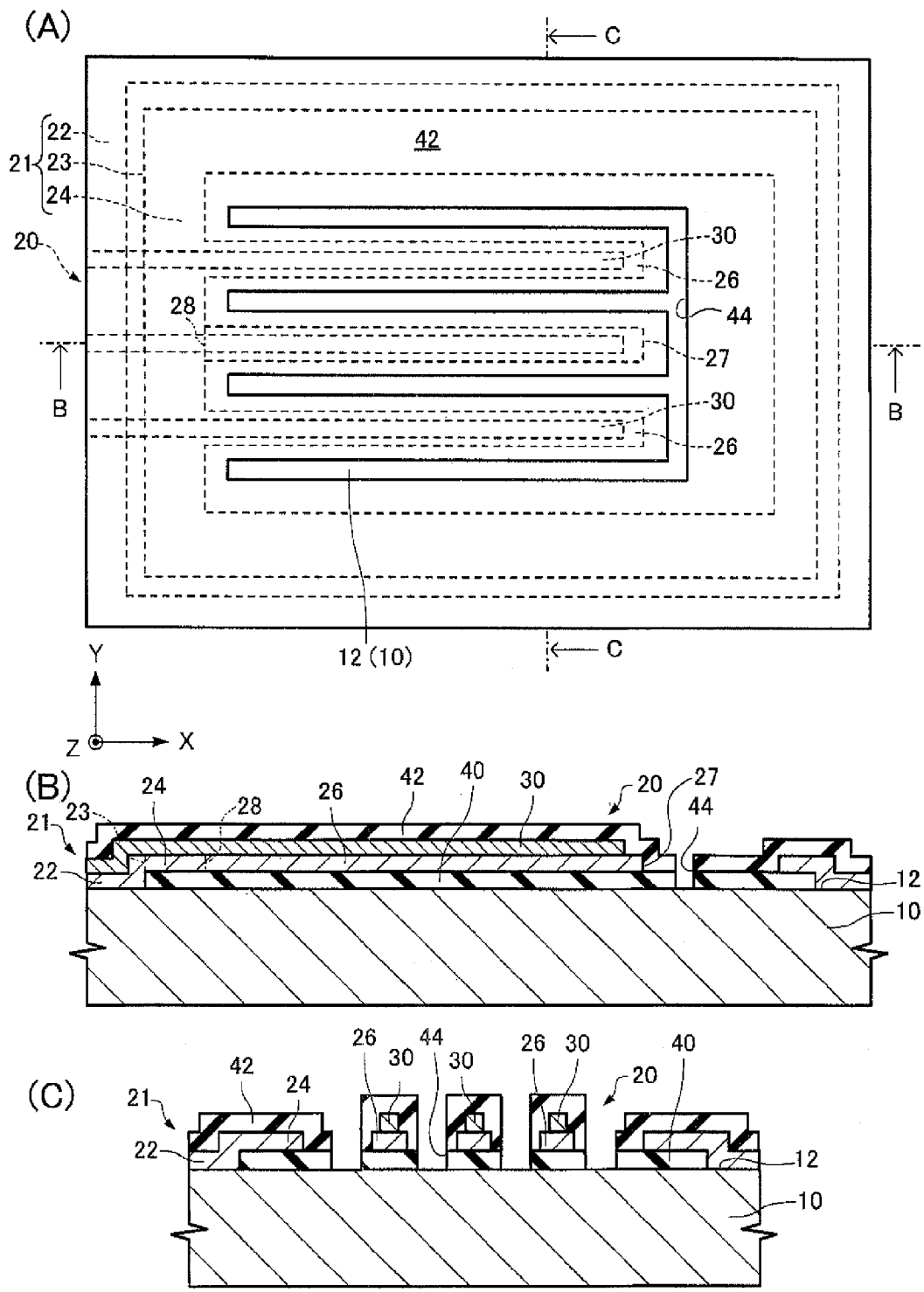
FIG. 10 shows a schematic plan view and cross-sectional views of a manufacturing step of the vibrator according to the embodiment of the invention.

As shown in FIG. 10, the coating layers 40 and 42 are patterned so as to leave the support portion 21 and the vibrating portions 26, thereby forming an opening 44 that exposes the surface 12 of the silicon substrate 10. The patterning is performed by photolithography and etching. In this example, the opening 44 has a planar shape that is a comb shape having a plurality of protruding portions extending in the x axis direction, and each vibrating portion 26 is located between an adjacent pair of the plurality of protruding portions.

Figure 11:
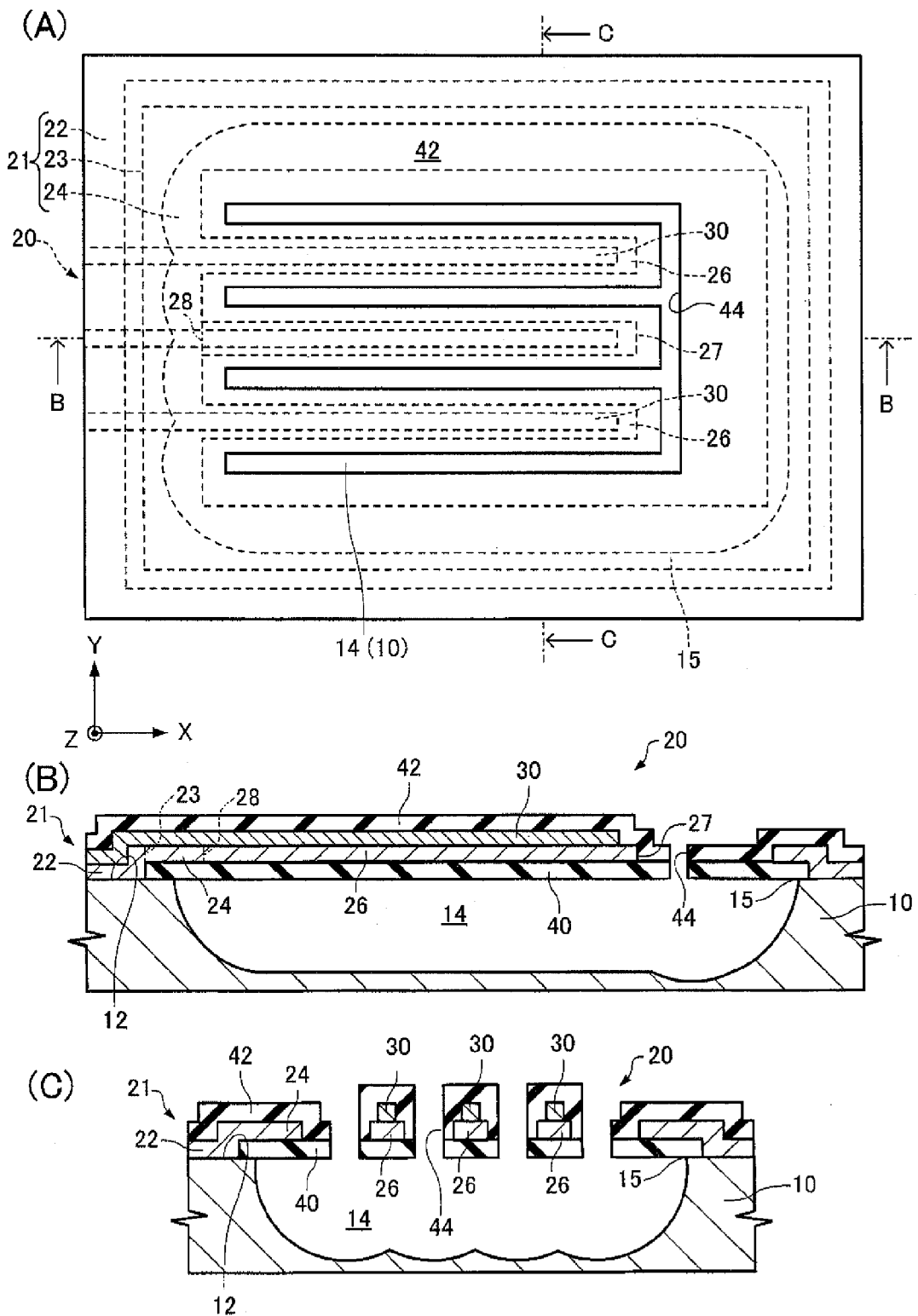
FIG. 11 shows a schematic plan view and cross-sectional views of a manufacturing step of the vibrator according to the embodiment of the invention.

As shown in FIG. 11, the silicon substrate 10 is removed through the opening 44 so as to form a recess portion 14 at a position that overlaps the vibrating portions 26 in plan view. To be specific, the silicon substrate 10 is etched by allowing an etching solution or etching gas to pass through the opening 44 so as to form the recess portion 14. The etching performed in this step is, for example, isotropic etching. To be more specific, etching performed in this step is performed by using TMAH (tetramethyl ammonium hydroxide), KOH, EDP (ethylene diamine pyrocatecol), $HF+HNO_3+CH_3COOH$, $XeF_2$, or $SF_6$. The depth D of the recess portion 14 is determined through this step. After the recess portion 14 has been formed, the recess portion 14 may be cleaned by using isopropyl alcohol (IPA) or water The coating layers 40 and 42 are removed as shown in FIG. 1. The coating layers 40 and 42 are removed by, for example, a known method. The support portion 21, the vibrating portions 26, and the piezoelectric elements 30 are exposed through this process.

A vibrator 100 can be manufactured through the above process.

The method for manufacturing a vibrator 100 has, for example, the following features.

The method for manufacturing a vibrator 100 includes: patterning the first coating layer 40 into a predetermined shape; forming a semiconductor layer 20 that covers the silicon substrate 10 and the first coating layer 40; forming a beam-shaped vibrating portion 26 and a support portion 21 that supports the vibrating portion on the first coating layer 40 by patterning the semiconductor layer 20; forming an opening 44 that exposes the silicon substrate 10 by patterning the first coating layer 40 so as to leave the vibrating portion 26 and the support portion 21; and forming a recess portion 14 at a position that overlaps the vibrating portion 26 by removing the silicon substrate 10 through the opening 44. Accordingly, in the method for manufacturing a vibrator 100, the border 23 between the first portion 22 and the second portion 24 is determined in the step of patterning the first coating layer 40 into a predetermined shape. Furthermore, the position of the root end 28 of the vibrating portion 26 (the border between the second portion 24 and the vibrating portion 26) is determined in the step of forming the vibrating portion 26 and the support portion 21. It is thereby possible to determine the length L2 of the second portion 24 of the support portion 21. Furthermore, in the method for manufacturing a vibrator 100, in the step of forming the recess portion 14, the depth D of the recess portion 14 can be determined.

As described above, in the method for manufacturing a vibrator 100, the length L2 of the second portion 24 of the support portion 21 and the depth D of the recess portion 14 can be determined separately and independently (without being in conjunction with each other). In other words, the length L2 of the second portion 24 and the depth D of the recess portion 14 can be controlled separately. Accordingly, the method for manufacturing a vibrator 100 can cope with various design requirements, and a vibrator 100 having a high level of accuracy can be obtained.

Furthermore, in the method for manufacturing a vibrator 100, the silicon substrate 10 is used. Accordingly, as described above, the vibrator 100 can be formed at a lower cost as compared to the case where an SOI substrate or the like is used.

As can be seen from the foregoing, according to the method for manufacturing a vibrator 100, it is possible to obtain a vibrator 100 having a high level of accuracy at a low cost.

The method for manufacturing a vibrator 100 includes, before the step of forming the opening 44, forming a second coating layer 42 that covers the support portion 21, the vibrating portion 26 and the piezoelectric element 30. It is therefore possible to, in the step of forming the recess portion 14, prevent the support portion 21, the vibrating portion 26 and the piezoelectric element 30 from being exposed to an etching solution or the like. Accordingly, the support portion 21, the vibrating portion 26 and the piezoelectric element 30 can be prevented from being etched.

The method for manufacturing a vibrator 100 includes, before the step of forming the vibrating portion 26 and the support portion 21, forming the piezoelectric element 30 on the semiconductor layer 20. It is thereby possible to cause the vibrating portion 26 to vibrate by the piezoelectric effect of the piezoelectric element 30.

In the method for manufacturing a vibrator 100, in the step of forming the vibrating portion 26 and the support portion 21, a plurality of vibrating portions 26 are formed, and adjacent ones of the vibrating portions are displaced in opposite directions from each other and vibrate in the thickness direction of the silicon substrate. This relieves stress (torsion) in the second portion 24 of the support portion 21 that is caused by vibrations of the vibrating portions 26. As a result, it is possible to prevent the stress caused by vibrations of the vibrating portions 26 from being transferred to the first portion 22 of the support portion 21.

According to the method for manufacturing a vibrator 100, as described above, the length L2 of the second portion 24 of the support portion 21 can be determined in the steps of patterning the first coating layer 40 into a predetermined shape and forming the vibrating portion 26 and the support portion 21. The patterning performed in these two steps is performed by photolithography and etching. Accordingly, variations in the length L2 of the second portion 24 can be reduced. As a result, a vibrator 100 having a high level of accuracy can be obtained.

3. Variations

Figure 12:
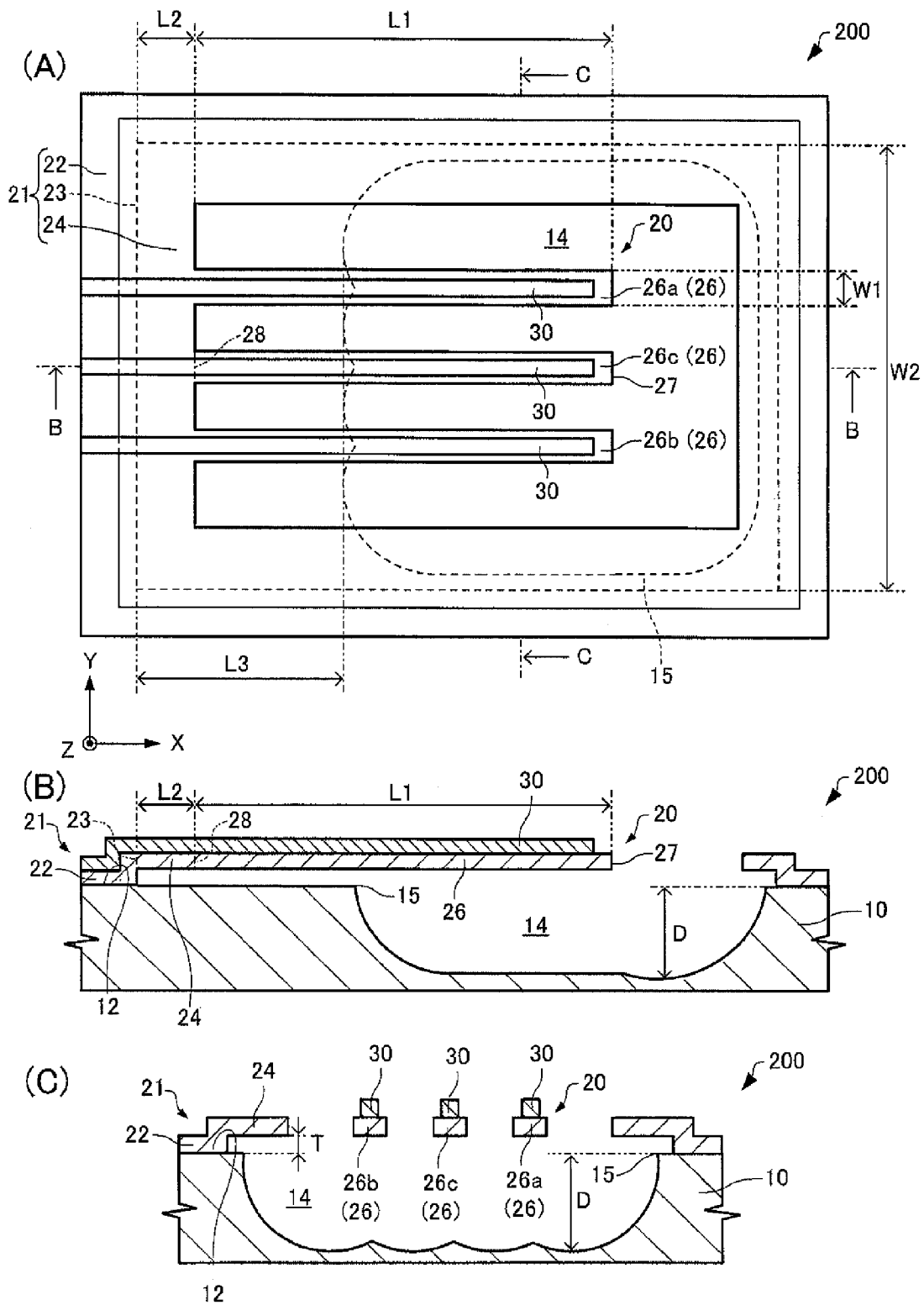
FIG. 12 shows a schematic plan view and cross-sectional views of a vibrator according to a variation of the embodiment of the invention.
Figure 13:
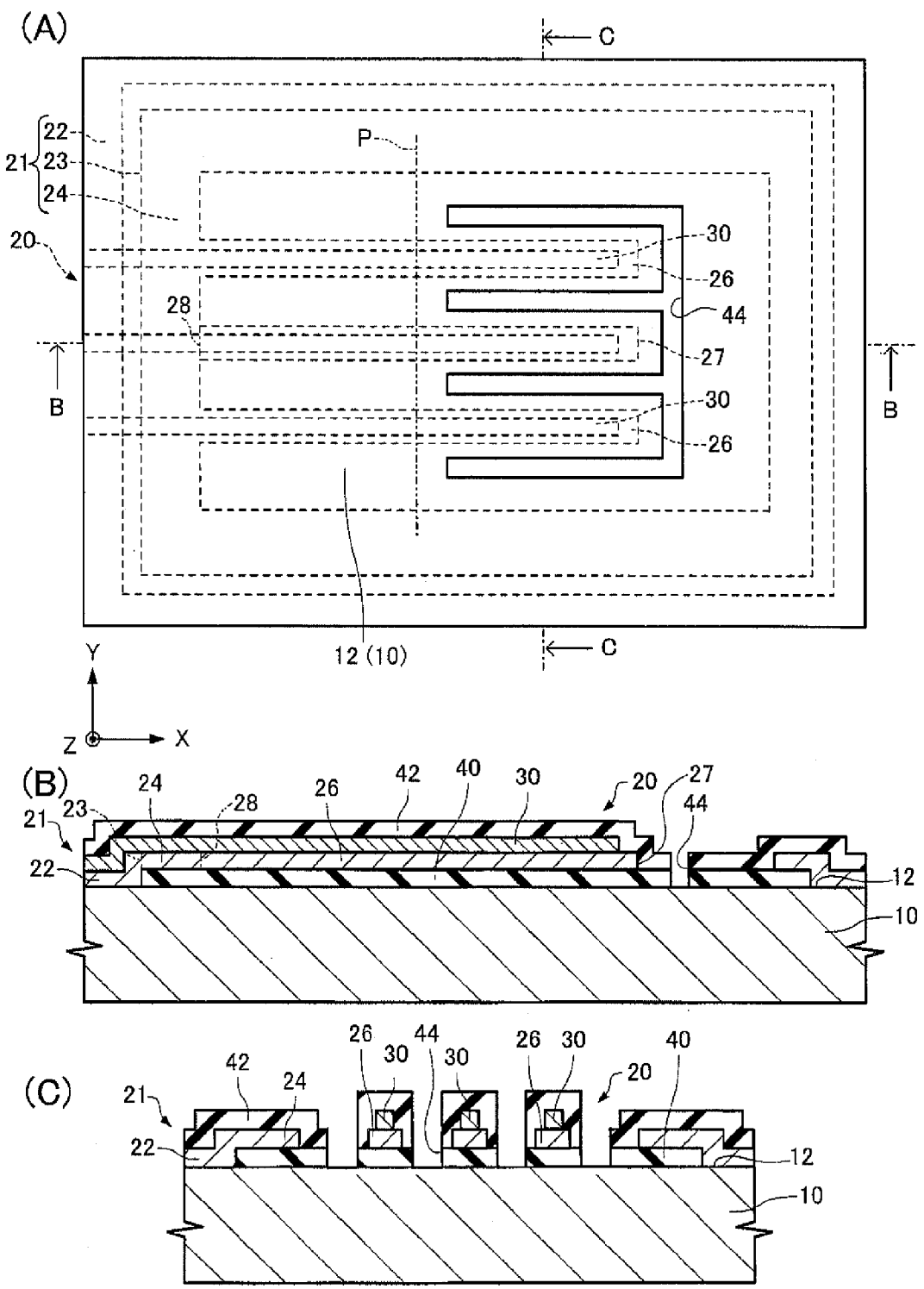
FIG. 13 shows a schematic plan view and cross-sectional views of a manufacturing step of the vibrator according the variation of the embodiment of the invention.

A vibrator according to a variation of the present embodiment will be described next with reference to the drawings. FIG. 12 shows a schematic plan view and cross-sectional views of a vibrator 200 according to a variation of the present embodiment. FIG. 13 shows a schematic plan view and cross-sectional views of a manufacturing step of the vibrator 200 according to the variation of the present embodiment, which correspond to FIG. 10. FIGS. 12A and 13A are plan views, FIGS. 12B and 13B are cross-sectional views taken along the line B-B of FIGS. 12A and 13A, respectively, and FIGS. 12C and 13C are cross-sectional views taken along the line C-C of FIGS. 12A and 13A, respectively. Also, in FIGS. 12A and 13A, three mutually orthogonal axes, namely, X axis, Y axis and Z axis, are shown.

Hereinafter, in the description of the vibrator 200 according to a variation of the present embodiment, members that function as in the same manner as those of the vibrator 100 of the present embodiment are given the same reference numerals, and a detailed description thereof is omitted here.

In the vibrator 100, as shown in FIG. 1, the second portion 24 of the support portion 21 is located above the edge 15 of the recess portion 14, and the vibrating portion 26 is not located above the edge 15. In contrast, in the vibrator 200, as shown in FIG. 12, the vibrating portion 26 is located above the edge 15. That is, in plan view, the vibrating portion 26 crosses the edge 15. Accordingly, in the vibrator 200, a distance L3 between the edge 15 and the first portion 22 of the support portion 21 (specifically, a distance between the edge 15 and a portion of the first portion 22 that is closest to the root end 28) can be increased as compared to that of the vibrator 100.

In a method for manufacturing the vibrator 200, as shown in FIG. 13, an opening 44 is formed on the tip end 27 side from the root end 28 of the vibrating portion 26 that is a single-anchored beam in the step of forming the opening 44. In this example, the opening 44 is formed on the tip end 27 side relative to an imaginary line P that divides the vibrating portion 26 into two equal parts in plan view. The imaginary line P is a straight line parallel to the Y axis.

The method for manufacturing the vibrator 200 is basically the same as the method for manufacturing the vibrator 100 except for the above-described difference. Accordingly, a detailed description thereof is omitted here.

The method for manufacturing the vibrator 200 has, for example, the following features.

According to the method for manufacturing the vibrator 200, it is possible to, for example, increase the distance L3 as compared to that of the vibrator 100. This more reliably causes the first portion 22 of the support portion 21 to be in contact with the surface 12 of the silicon substrate 10 even if, for example, the amount of overetching that occurs when forming the recess portion 14 is large.

According to the method for manufacturing the vibrator 200, the vibrating portion 26 is formed above the edge 15 of the recess portion 14. Accordingly, in the vibrator 200, even if, for example, the vibrating portion 26 is displaced toward the bottom surface of the recess portion 14 due to the surface tension in the step of cleaning the recess portion 14, the vibrating portion 26 comes into contact with the edge 15 before the tip end 27 of the vibrating portion 26 comes into contact with the bottom surface of the recess portion 14. It is therefore possible to more reliably prevent sticking in the vibrator 200.

4. Oscillator

Figure 14:
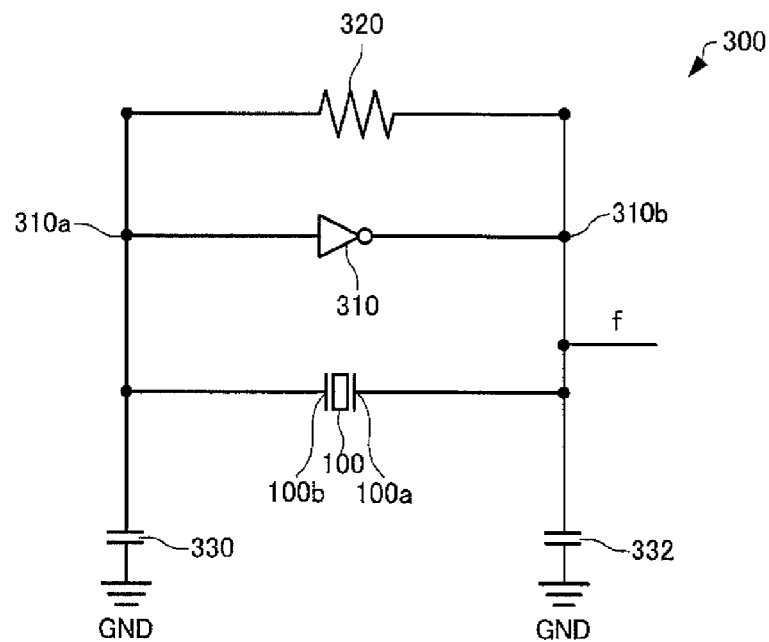
FIG. 14 is a circuit diagram showing an oscillator according to an embodiment of the invention.

An oscillator according to the present embodiment will be described next with reference to the drawings. FIG. 14 is a circuit diagram showing an oscillator 300 according to the present embodiment.

As shown in FIG. 14, the oscillator 300 includes, for example, the vibrator of the invention, and an inverting amplifier circuit (circuit portion) 310. Hereinafter, the oscillator 300 including a vibrator 100, which is the vibrator of the invention, will be described.

The vibrator 100 includes, for example, a first terminal 100a that is electrically connected to the above-described first pad, and a second terminal 100b that is electrically connected to the above-described second pad. The first terminal 100a is at least AC connected to an output terminal 310b of the inverting amplifier circuit 310. The second terminal 100b is at least AC connected to an input terminal 310a of the inverting amplifier circuit 310. The inverting amplifier circuit 310 constitutes a circuit for driving the vibrating portions 26 of the vibrator 100.

In this example, the inverting amplifier circuit 310 is constituted by a single inverter, but may be constituted by combining a plurality of inverters (inverter circuits) and amplifier circuits so as to satisfy the desired oscillator conditions.

The oscillator 300 may include a feedback resistor to the inverting amplifier circuit 310. In the example shown in FIG. 14, the input and output terminals of the inverting amplifier circuit 310 are connected via a resistor 320.

The oscillator 300 includes a first capacitor 330 that is connected between the input terminal 310a of the inverting amplifier circuit 310 and a reference potential (ground potential), and a second capacitor 332 that is connected between the output terminal 310b of the inverting amplifier circuit 310 and a reference potential (ground potential). With this configuration, the vibrator 100 and the capacitors 330 and 332 can together form an oscillator circuit that constitutes a resonance circuit. The oscillator 300 outputs an oscillator signal f obtained with the oscillator circuit.

The elements (not shown) such as transistors and capacitors that constitute the oscillator 300 may be formed, for example, on the silicon substrate 10 (see FIG. 1). It is thereby possible to monolithically form the vibrator 100 and the inverting amplifier circuit 310.

Figure 15:
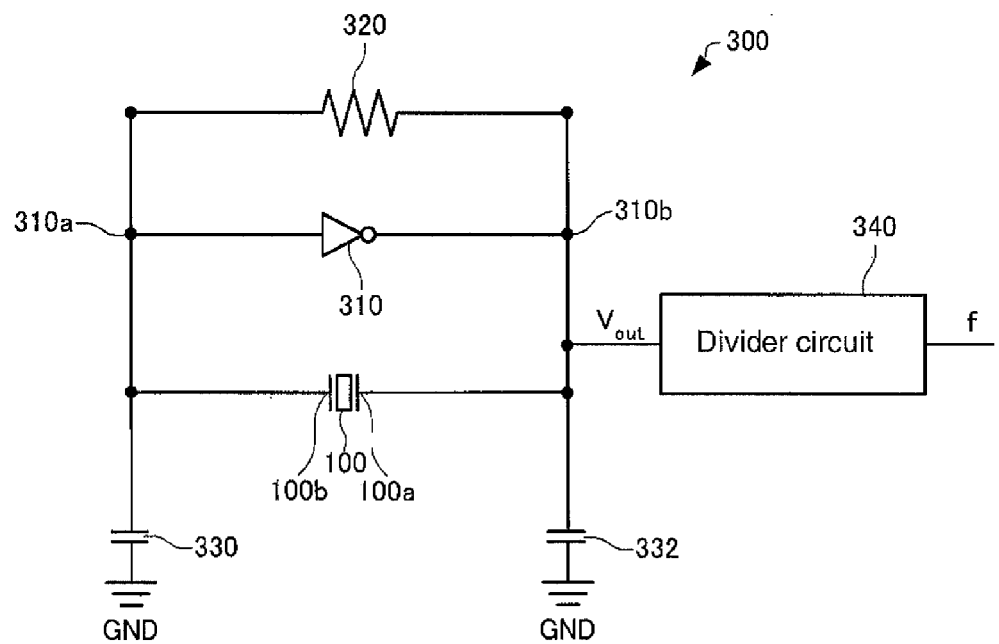
FIG. 15 is a circuit diagram showing an oscillator according to a variation of the embodiment of the invention.

As shown in FIG. 15, the oscillator 300 may further include a divider circuit 340. The divider circuit 340 divides an output signal $V_{out}$ of the oscillator circuit, and outputs an oscillator signal f. The oscillator 300 can thereby obtain, for example, an output signal having a frequency lower than that of the output signal $V_{out}$.

The oscillator 300 includes the vibrator 100. Therefore, the oscillator 300 can have a high level of accuracy at a low cost.

The embodiments and variations given above are merely examples, and thus the present invention is not limited thereto. It is possible to, for example, combine the embodiments and the variations as appropriate.

The invention encompasses configurations that are substantially the same as those described in the embodiments given above (for example, configurations having the same functions, methods and results, or configurations having the same objects and advantageous effects). The invention also encompasses configurations obtained by replacing a part that is not essential to the configurations described in the embodiments given above by another part. The invention also encompasses configurations that can achieve the same advantageous effects or the same objects as those described in the embodiments given above. The invention also encompasses configurations obtained by adding a known technique to the configurations described in the embodiments given above.

What is claimed is:

1. A vibrator comprising:
   a silicon substrate having a recess portion formed from a surface thereof; and
   a semiconductor layer having:
     a beam-shaped vibrating portion that is formed above the recess portion with a gap interposed therebetween; and
     a support portion that is formed on the surface and supports the vibrating portion, the support portion including:
       a first portion that is fixed to the surface; and
       a second portion that connects the first portion and the vibrating portion and is formed above the surface with a gap interposed between the surface and the second portion,
   wherein the vibrating portion extends in a first direction from the second portion, and
   a dimension in a second direction of the second portion is greater than a dimension in the second direction of the vibrating portion, the second direction being a direction intersecting the first direction.

2. An oscillator comprising:
   the vibrator according to claim 1; and
   a circuit portion for driving the vibrating portion.

\* \* \* \* \*